US007909614B1

(12) United States Patent
Chang

(10) Patent No.: US 7,909,614 B1

(45) Date of Patent: Mar. 22, 2011

(54) ANTI-ROTATION CONNECTOR FOR SHIELDING STRUCTURE

(75) Inventor: Kung-Lung Chang, Taipei (TW)

(73) Assignee: Ezconn Corporation, Taipei (TW)

( * ) Notice: Subject to any disclaimer, the term of this patent is extended or adjusted under 35 U.S.C. 154(b) by 0 days.

(21) Appl. No.: 12/591,758

(22) Filed: Dec. 1, 2009

(51) Int. Cl.
*H01R 12/00* (2006.01)
*H05K 1/00* (2006.01)

(52) U.S. Cl. .......................................... 439/63; 439/581

(58) Field of Classification Search .................... 439/63, 439/581, 55
See application file for complete search history.

(56) References Cited

U.S. PATENT DOCUMENTS

| | | | | |
|---|---|---|---|---|
| 4,469,390 | A * | 9/1984 | LeVine et al. | 439/394 |
| 4,540,231 | A * | 9/1985 | Forney, Jr. | 439/306 |
| 4,645,288 | A * | 2/1987 | Stursa | 439/581 |
| 5,011,415 | A * | 4/1991 | Suzuki et al. | 439/63 |
| 5,215,470 | A * | 6/1993 | Henry et al. | 439/63 |
| 6,837,754 | B1 * | 1/2005 | Walton | 439/798 |
| 6,855,012 | B2 * | 2/2005 | An | 439/793 |
| 6,992,544 | B2 * | 1/2006 | Barnes et al. | 333/33 |
| 2010/0022125 | A1 * | 1/2010 | Burris et al. | 439/584 |

* cited by examiner

*Primary Examiner* — Hae Moon Hyeon
(74) *Attorney, Agent, or Firm* — Rosenberg, Klein & Lee

(57) ABSTRACT

An anti-rotation connector for shielding structure, including: a sleeve having an internal stepped receiving hole; an insulating assembly disposed in the stopped receiving hole, the insulating assembly including a first insulating member and a second insulating member; a contact member having a contact section arranged in the first and second insulating members; and a first anti-rotation structure. The first anti-rotation structure includes multiple first splines and multiple first splineways disposed between the sleeve and the first insulating member for securely connecting the sleeve with the first insulating member. The anti-rotation connector further includes a second anti-rotation structure disposed between the first insulating member and the contact member for securely connecting the first insulating member with the contact member.

5 Claims, 6 Drawing Sheets

ANTI-ROTATION CONNECTOR FOR SHIELDING STRUCTURE

FIELD OF THE INVENTION

The present invention relates generally to a connector, and more particularly to an anti-rotation connector for shielding structure.

BACKGROUND OF THE INVENTION

Referring to FIGS. 1A and 1B, a conventional shielding device 10 is fixed on a printed circuit (PC) board by means of soldering. The shielding device 10 includes a frame body 11 and a connector 12 connected with the frame body 11 for signal output/input. In general, the connector 12 is fixed on the PC board through a soldering process, for example, by means of an infra-red (IR) reflow soldering oven. The IR reflow soldering oven is equipped with a heating unit having different temperature divisions for preheating/melting/condensing/cooling/solidifying the soldering paste, wherein the process temperature of the melting division ranges from about 230° C. to 265° C.

The connector 12 includes a metal sleeve 13 having a receiving hole 14 for receiving therein a first insulating member 15 and a second insulating member 16. A connection section 17 is disposed at a front end of the sleeve 13. The connection section 17 is inserted in a connection hole 18 of the frame body 11. The periphery of a juncture between the connection section 17 and a wall of the connection hole 18 is riveted and welded to integrally connect the connector 12 with the frame body 11. The connector 12 further includes a contact member 19 arranged in the first and second insulating members 15, 16. The contact member 19 has a rear end connected to a conductive wire of the PC board, whereby the contact member 19 is electrically connected with the PC board.

When the connector 12 is manually welded with the frame body 11, the welding hand tool is set to a high temperature of about 280° C. according to heat resistance of the components. However, the first insulating member 15 is made of nylon material, which has a heat resistance under about 200° C. As a result, after welded at high temperature, the first insulating member 15 will contract and deform and become freely rotatable within the sleeve 13.

Furthermore, the connector 12 is adhered to the PC board by means of IR reflow soldering oven. After welded at high temperature, the contact member 19 and the first insulating member 15 as well as the connection section 17 will deform and become freely rotatable relative to each other.

Accordingly, in a high-temperature operation environment, the first insulating member 15 is likely to deform and become freely rotatable within the sleeve 13. Also, the contact member 19 will become freely rotatable relative to the first insulating member 15. This is because the connector 12 has no anti-rotation structure.

SUMMARY OF THE INVENTION

A primary object of the present invention is to provide a connector with anti-rotation structure.

To achieve the above and other objects, the anti-rotation connector for shielding structure of the present invention includes: a sleeve having a first end and a second end, the sleeve also having an internal stepped receiving hole; an insulating assembly including a first insulating member disposed in the receiving hole of the sleeve near the first end thereof and a second insulating member arranged in the receiving hole of the sleeve near the second end thereof; a contact member having a contact section arranged in the first and second insulating members and a rear end section electrically connected to the PC board; and a first anti-rotation structure including multiple first splines and multiple first splineways disposed between the sleeve and the first insulating member for securely connecting the sleeve with the first insulating member.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
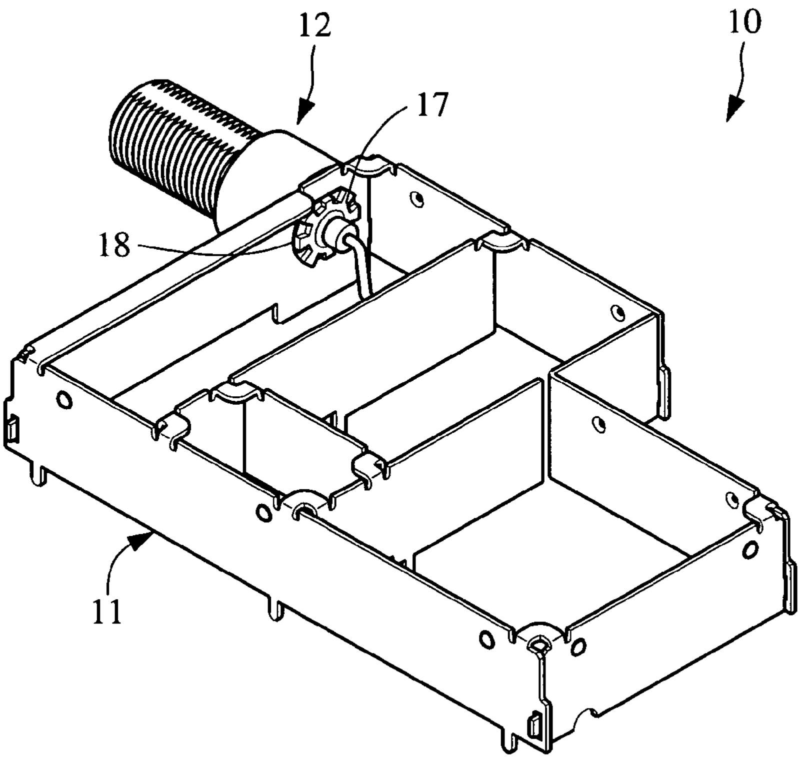
FIG.1A PRIOR ART
FIG. 1A is a perspective view of a conventional shielding device with a connector.
Figure 1B:
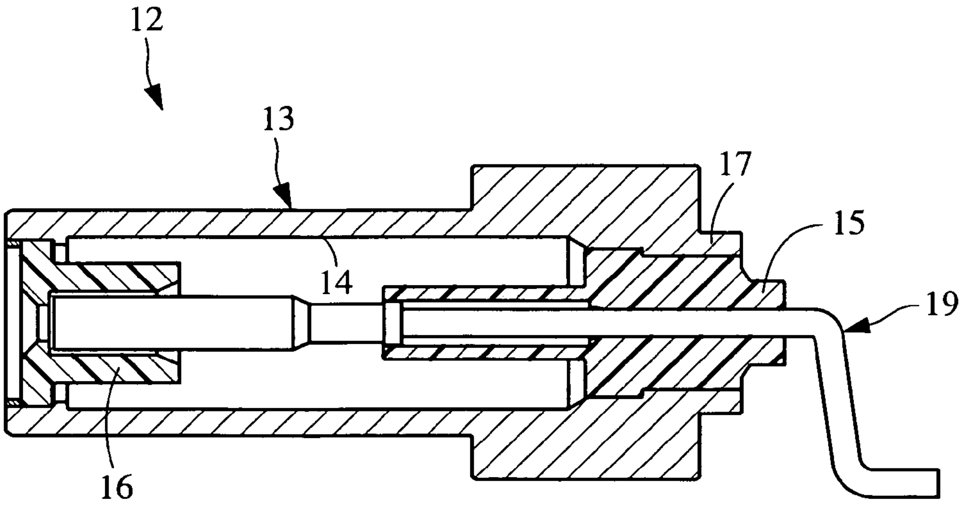
FIG.1B PRIOR ART
FIG. 1B is a sectional view of the connector of the conventional shielding device.
Figure 3:
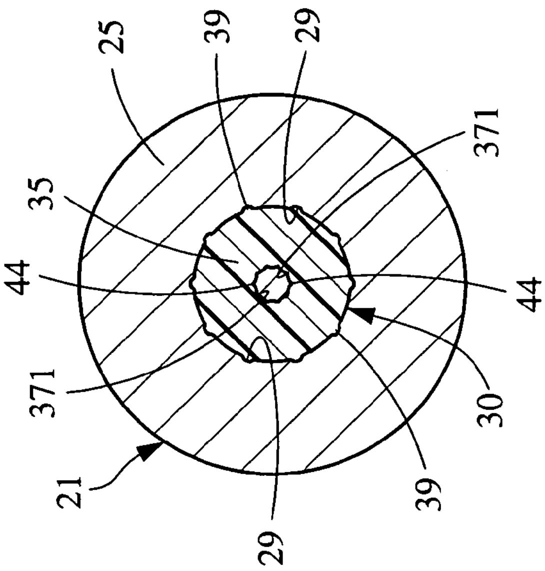
FIG. 3 is a sectional view taken along line 3-3 of FIG. 2.
Figure 2:
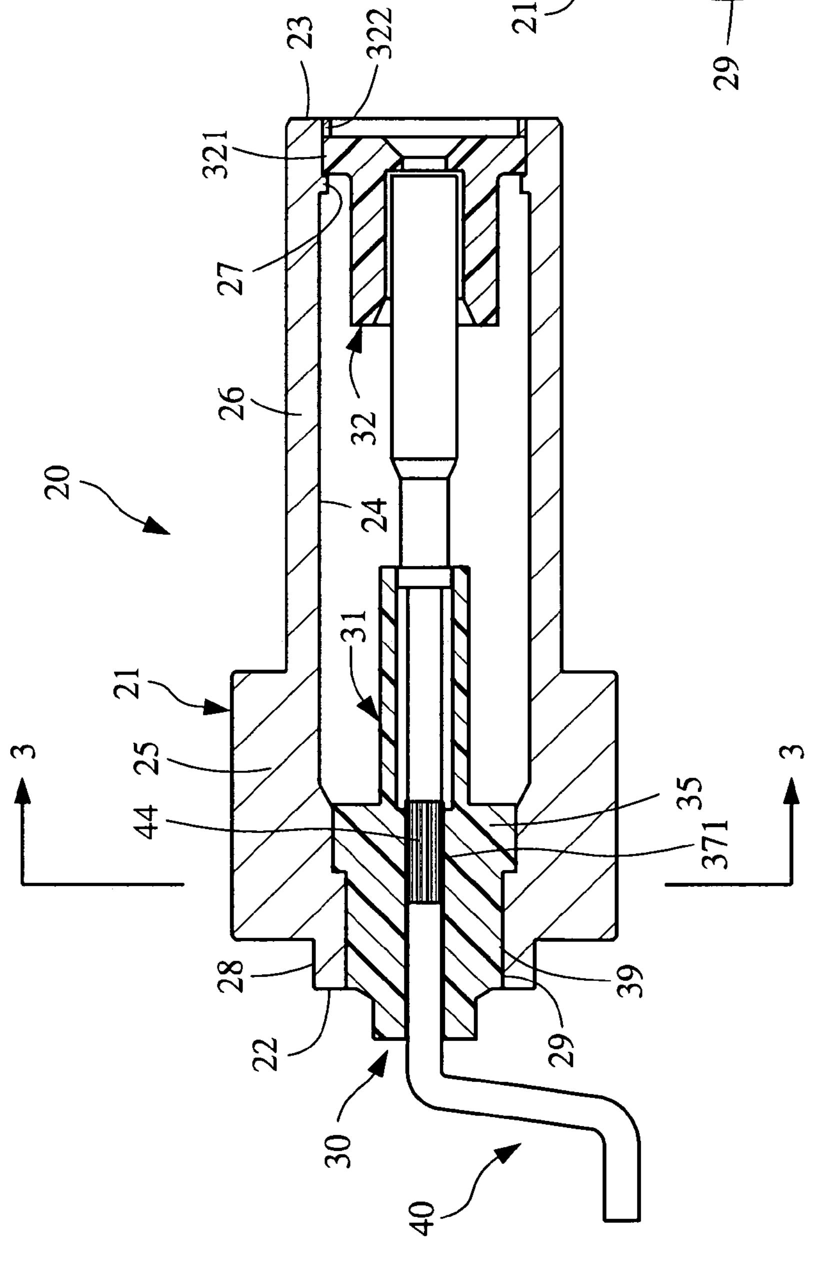
FIG. 2 is a sectional view of a first embodiment of the anti-rotation connector of the present invention.

Please refer to FIGS. 2 and 3. According to a first embodiment, the anti-rotation connector 20 for shielding structure of the present invention includes a metal sleeve 21, an insulating assembly 30 and a contact member 40.

Figure 4:
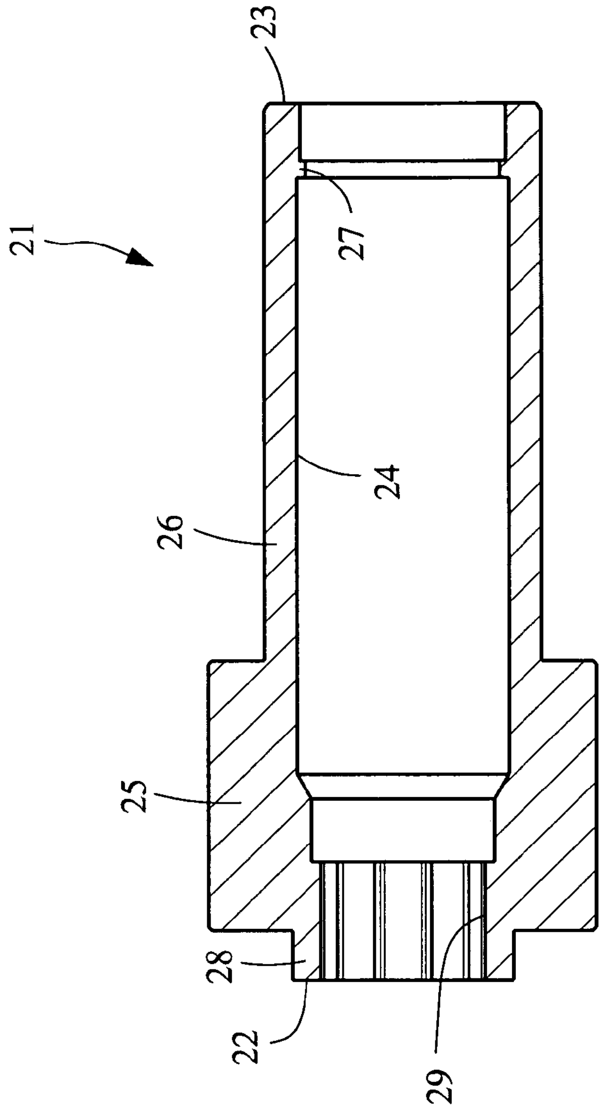
FIGS. 4 and 5 are a sectional view and a right side view of the sleeve of the present invention respectively.
Figure 5:
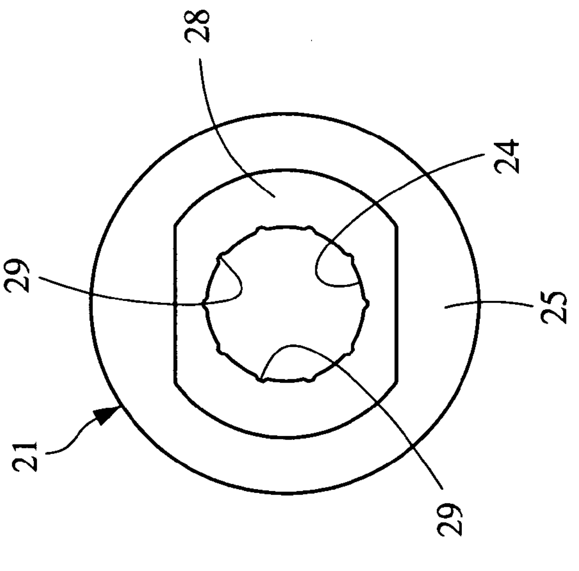
Figure 7:
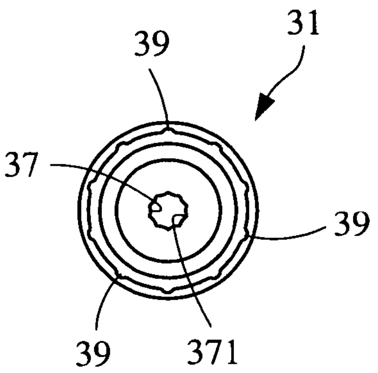
FIGS. 6 to 8 are a plane view, a right side view and a sectional view of the first insulating member of the present invention respectively.

Referring to FIGS. 4 and 5, the sleeve 21 serves to accommodate the insulating assembly 30 therein. The sleeve 21 has a first end 22 and a second end 23. The sleeve 21 also has an internal stepped receiving hole 24. The sleeve 21 further has a sleeve main body 25, a tubular end section 26 and a connection section 28 positioned at the first end 22 of the sleeve 21. The tubular end section 26 has an outer diameter and a wall thickness smaller than those of the sleeve main body 25. A stopper section 27 is disposed on inner surface of the stepped receiving hole 24 near the second end 23 of the sleeve 21. Multiple first splineways 29 are formed on inner surface of the receiving hole 24 near the first end 22 of the sleeve 21 at equal or unequal intervals. The first splineways 29 are directed in a direction along axial direction of the sleeve 21. An outer circumference of the tubular end section 26 is formed with a thread for mechanically and electrically connecting with an interference connector having a thread.

Figure 6:
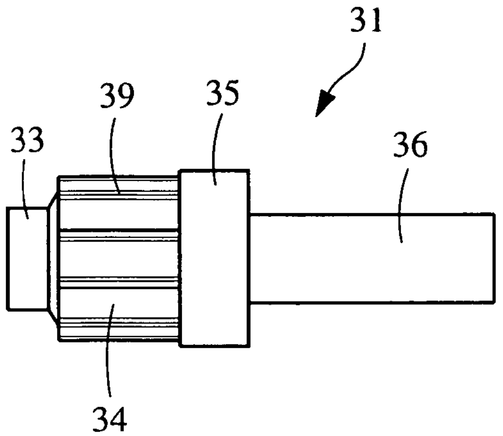
Figure 8:
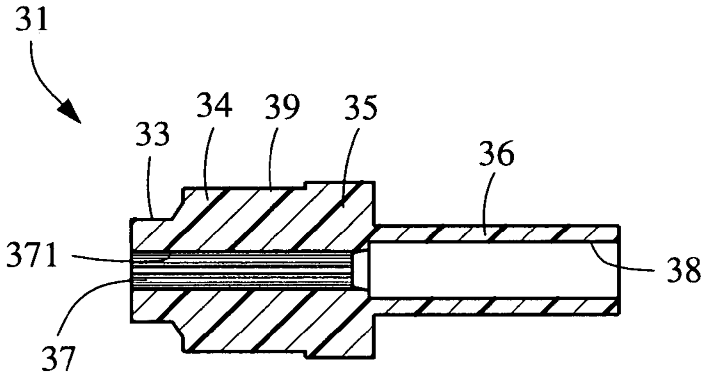

The insulating assembly 30 is coaxially arranged in the receiving hole 24 of the sleeve 21. The insulating assembly 30 includes a first insulating member 31 positioned at the first end 22 of the sleeve 21 and a second insulating member 32 positioned at the second end 23 of the sleeve 21. As shown in FIGS. 6 and 8, the first insulating member 31 has a first through hole 37 and a second through hole 38. The second through hole 38 has a dimension larger than that of the first through hole 37. The first insulating member 31 includes a front end extension section 33, an interface section 34, an outer flange 35 and a rear end extension section 36. The outer flange 35 has such a dimension as to be fitted in the receiving hole 24 of the sleeve 21. An outer surface of the interface section 34 are formed with multiple first splines 39 complementary to the first splineways 29 of the sleeve 21. When the first insulating member 31 is connected to the sleeve 21, the first splines 39 are inlaid into the first splineways 29 to engage therewith. Accordingly, by means of a first anti-rotation structure, (that is, the first splines 39 and the first splineways 29), the first insulating member 31 is securely connected with the sleeve 21. Under such circumstance, the problem existing in the conventional shielding device can be solved that after the sleeve is welded with the frame body at high temperature, the first insulating member will become freely rotatable within the sleeve.

The first insulating member 31 further has multiple second splineways 371 formed on inner surface of the first through hole 37 at equal or unequal intervals. The second splineways 371 are directed in a direction along axial direction of the first insulating member 31.

The second insulating member 32 is installed in the receiving hole 24 by means of an annular member 322. An outer flange 321 of the second insulating member 32 is sandwiched between the stopper section 27 and the annular member 322, whereby the second insulating member 32 is firmly rested in the sleeve 21. The insulating assembly 30 serves to insulate the sleeve 21 from the contact member 40.

Figure 9:
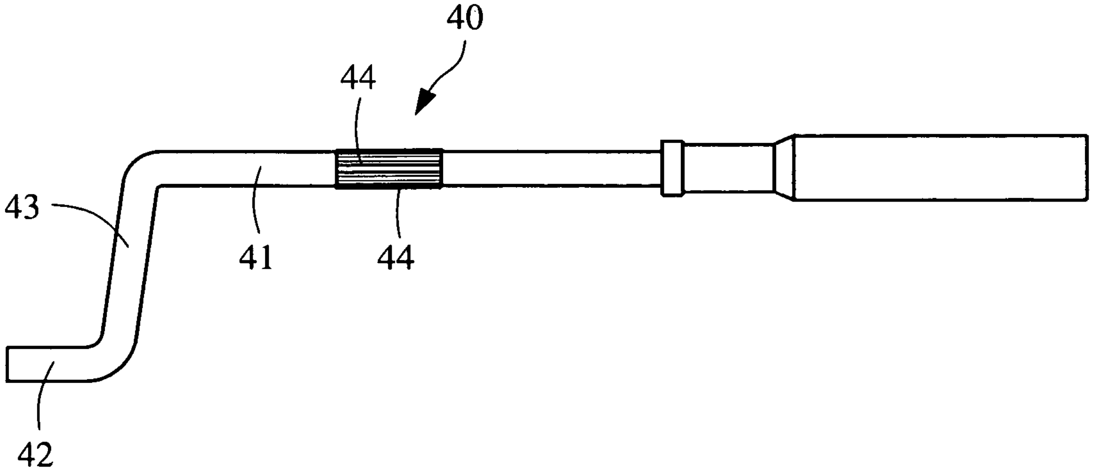
FIG. 9 is a plane view of the contact member of the present invention.

As shown in FIG. 9, the contact member 40 is a rod-like member, having a contact section 41, a rear end section 42 and a connection section 43 positioned between the contact section 41 and the rear end section 42. The contact section 41 is arranged in the first and second insulating members 31, 32. The rear end section 42 is connectable to a conductive wire of a PC board to electrically connect the contact member 40 with the PC board. An outer surface of the contact section 41 is formed with multiple second splines 44 complementary to the second splineways 371 of the first insulating member 31. When the contact member 40 is connected to the first insulating member 31, the second splines 44 of the contact section 41 are inlaid into the second splineways 371 of the first insulating member 31 to engage therewith. Accordingly, by means of a second anti-rotation structure, (that is, the second splines 44 and the second splineways 371), the contact member 40 is securely connected with the first insulating member 31. Under such circumstance, the problem existing in the conventional shielding device can be solved that after the connector is adhered to the PC board at high temperature, the first insulating member and the contact member will become freely rotatable relative to each other.

Figure 10:
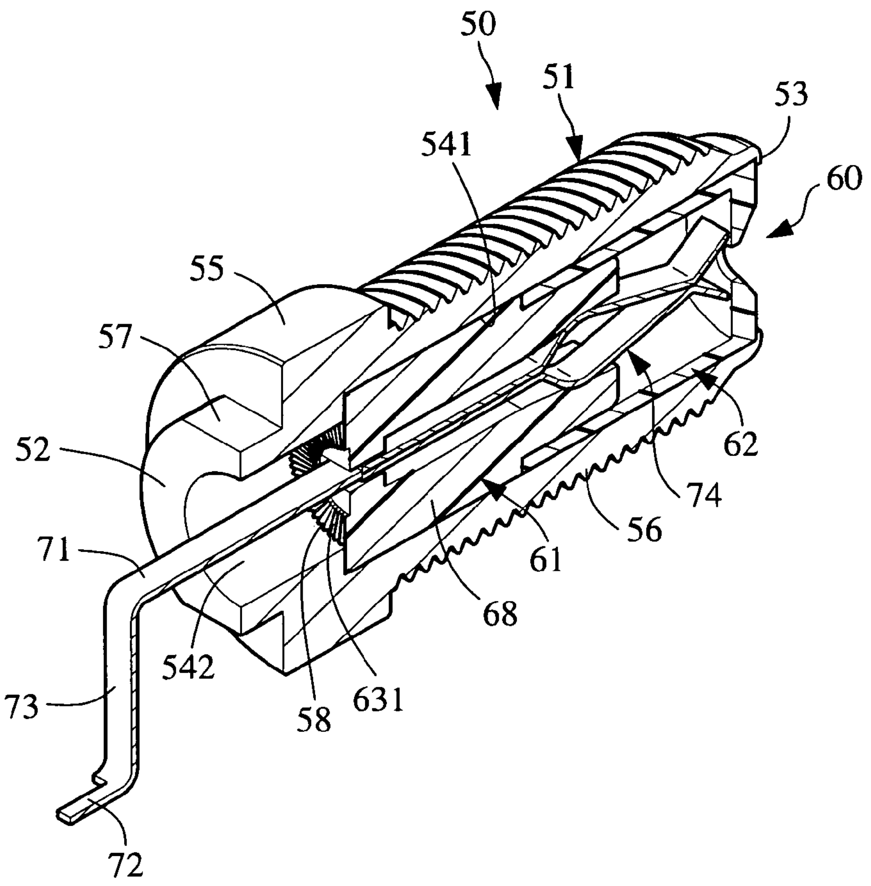
FIG. 10 is a perspective sectional view of a second embodiment of the anti-rotation connector of the present invention.

Please refer to FIG. 10, which shows a second embodiment of the anti-rotation connector 50 for shielding structure of the present invention. In this embodiment, the position of the first anti-rotation structure is changed in adaptation to different assembling positions between different types of insulating assemblies and sleeves. The anti-rotation connector 50 includes a metal sleeve 51, an insulating assembly 60 and a contact member 70.

Figure 11:
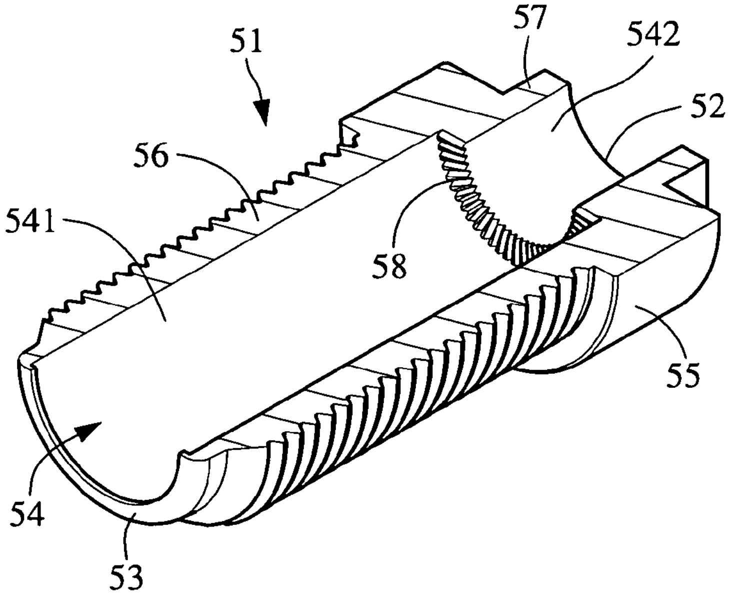
FIG. 11 is a perspective sectional view of the sleeve according to FIG. 10.

As shown in FIG. 11, the sleeve 51 serves to accommodate the insulating assembly 60 therein. The sleeve 51 has a first end 52 and a second end 53. The sleeve 51 has an internal stepped receiving hole 54 composed of a long cavity 541 and a short cavity 542. The long cavity 541 terminates at a plane bottom section. The sleeve 51 has a sleeve main body 55, a tubular end section 56 and a connection section 57 positioned at the first end 52 of the sleeve 51. The end section 56 has an outer diameter and a wall thickness smaller than those of the sleeve main body 55. Multiple first splineways 58 are formed on a surface of the plane bottom section of the long cavity 541 at equal or unequal intervals. The first splineways 58 are directed in a direction other than axial direction of the sleeve 51. An outer circumference of the tubular end section 56 is formed with a thread for mechanically and electrically connecting with an interface connector having a thread.

Figure 12:
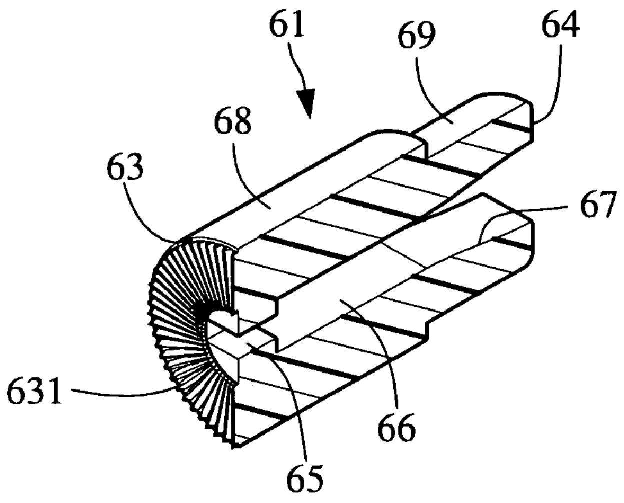
FIG. 12 is a perspective sectional view of the first insulating member according to FIG. 10.

The insulating assembly 60 is coaxially arranged in the long cavity 541 of the receiving hole 54 of the sleeve 51. The insulating assembly 60 includes a first insulating member 61 and a second insulating member 62. The first and second insulating members 61, 62 together form a tubular member. As shown in FIG. 12, the first insulating member 61 has a first end 63 and a second end 64. Also, the first insulating member 61 has a socket 65 and an internal passage 66. A rear end of the passage 66 is formed with a slope 67 positioned at the second end 64 of the first insulating member 61. The first insulating member 61 includes a first tubular end section 68 and a second tubular end section 69. The first tubular end section 68 has such a dimension as to be received in the long cavity 541 of the sleeve 51. An end face of the first end 63 of the first insulating member 61 is formed with multiple first splines 631 complementary to the first splineways 58 of the sleeve 51. When the first insulating member 61 is connected to the sleeve 51, the first splines 631 are inlaid into the first splineways 58 to engage therewith. Accordingly, by means of a first anti-rotation structure, (that is, the first splines 631 and the first splineways 58), the first insulating member 61 is securely connected with the sleeve 51. Under such circumstance, the problem existing in the conventional shielding device can be solved that after the sleeve is welded with the frame body at high temperature, the first insulating member will become freely rotatable within the sleeve.

Figure 13:
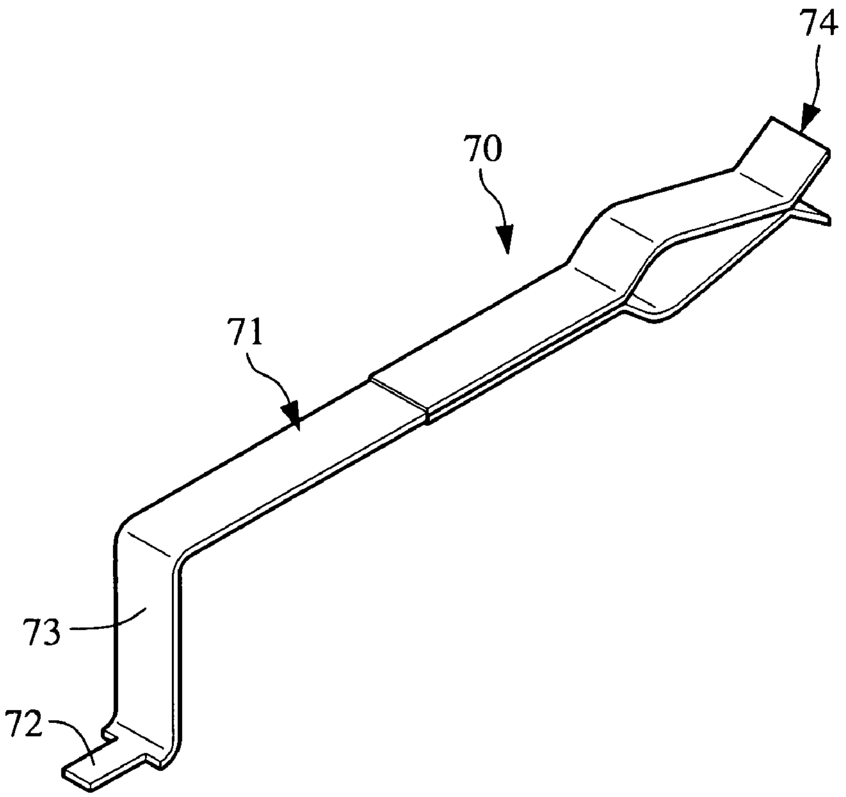
FIG. 13 is a perspective view of the contact member according to FIG. 10.

Referring to FIG. 13, the contact member 70 is a plate-like member arranged in the insulating assembly 60. The contact member 70 has a contact section 71, a rear end section 72 and a connection section 73 positioned between the contact section 71 and the rear end section 72. A free end of the contact section 71 has a resilient clip 74 positioned on the slope 67 of the first insulating member 61 and extending to the second insulating member 62. An internal conductor of a mating connector can be clipped and held in the resilient clip 74 to electrically connect therewith. The rear end section 72 is connectable to a conductive wire of a PC board to electrically connect the contact member 70 with the PC board.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An anti-rotation connector for shielding structure, the shielding structure being fixable on a printed circuit (PC) board with the anti-rotation connector electrically connected to the PC board, said anti-rotation connector comprising:

a sleeve having a first end and a second end, the sleeve also having an internal stepped receiving hole;

an insulating assembly including a first insulating member disposed in the receiving hole of the sleeve near the first end thereof and a second insulating member arranged in the receiving hole of the sleeve near the second end thereof;

a contact member having a contact section arranged in the first and second insulating members and a rear end section electrically connected to the PC board; and a first anti-rotation structure including multiple first splines and multiple first splineways disposed between the sleeve and the first insulating member for securely connecting the sleeve with the first insulating member;

wherein each of said multiple first splines are inlaid into a corresponding one of said multiple first splineways, and said multiple first splines and said multiple first splineways are formed axially to said sleeve.

2. The anti-rotation connector for shielding structure as claimed in claim 1, wherein the first splines are formed on outer surface of the first insulating member, while the first splineways are formed on inner surface of the receiving hole of the sleeve and complementary to the first splines.

3. The anti-rotation connector for shielding structure as claimed in claim 1, wherein the stepped receiving hole of the sleeve is composed of a long cavity and a short cavity, the long cavity terminating at an annular plane bottom section, the first splineways being formed on a surface of the plane bottom section, while the first splines being formed on an end face of an end of the first insulating member and complementary to the first splineways.

4. The anti-rotation connector for shielding structure as claimed in claim 1, wherein a second anti-rotation structure is disposed between the first insulating member and the contact member for securely connecting the first insulating member with the contact member.

5. The anti-rotation connector for shielding structure as claimed in claim 4, wherein the second anti-rotation structure includes multiple second splines formed on outer surface of the contact section of the contact member and multiple second splineways formed on inner surface of the first insulating member and complementary to the second splines of the contact section.

* * * * *